United States Patent
Liu et al.

(10) Patent No.: US 7,256,136 B2
(45) Date of Patent: Aug. 14, 2007

(54) SELF-PATTERNING OF PHOTO-ACTIVE DIELECTRIC MATERIALS FOR INTERCONNECT ISOLATION

(75) Inventors: Wuping Liu, Singapore (SG); Bei Chao Zhang, S'pore (SG); Liang Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 11/345,890

(22) Filed: Feb. 2, 2006

(65) Prior Publication Data

US 2006/0128156 A1   Jun. 15, 2006

Related U.S. Application Data

(62) Division of application No. 10/697,745, filed on Oct. 30, 2003, now Pat. No. 7,012,022.

(51) Int. Cl.
*H01L 21/64* (2006.01)

(52) U.S. Cl. ............... 438/725; 438/627; 438/636; 438/637; 438/700; 216/17; 216/18

(58) Field of Classification Search ............ 216/17; 438/725
See application file for complete search history.

(56) References Cited

U.S. PATENT DOCUMENTS

| 5,334,488 | A   |   | 8/1994 | Shipley, Jr. .............. 430/315 |
| 6,349,456 | B1  |   | 2/2002 | Dunn et al. .............. 29/25.42 |
| 6,429,116 | B1  | * | 8/2002 | Wang et al. .............. 438/623 |
| 6,506,979 | B1  |   | 1/2003 | Shelnut et al. ............ 174/255 |
| 6,521,328 | B1  |   | 2/2003 | Lauffer et al. ............ 428/209 |
| 6,872,666 | B2  | * | 3/2005 | Morrow .................... 438/700 |

OTHER PUBLICATIONS

S. Wolf, Silicon Processing for the VLSI Era, vol. 4, Lattic Press (2002), pp. 645 and 639.*

* cited by examiner

*Primary Examiner*—Shamim Ahmed
*Assistant Examiner*—Maki Angadi

(57) ABSTRACT

In accordance with the objectives of the invention a new method is provided for the creation of an interconnect pattern. The invention provides for a layer of Photo-Active Dielectric (PAD) to be used for the insulation material in which the interconnect pattern is created, this without the use of an overlying exposure mask of photoresist.

22 Claims, 8 Drawing Sheets

SELF-PATTERNING OF PHOTO-ACTIVE DIELECTRIC MATERIALS FOR INTERCONNECT ISOLATION

The application has been amended as follows: This is a division of patent application Ser. No. 10/697,745 filing date Oct. 30, 2003 now U.S. Pat. No. 7,012,022.

BACKGROUND OF THE INVENTION (1) Field of the Invention

The invention relates to the fabrication of integrated circuit devices, and more particularly, to a method of creating a pattern for conductive interconnects in a layer of photo-active dielectric material without using a separate layer of photoresist for the exposure and patterning of the layer of photo-active dielectric material.

(2) Description of the Prior Art

In the formation of semiconductor integrated circuits, it is common practice to form interconnect metal line structures on a number of different levels within the structure and interconnecting the various levels of wiring with contact or via openings.

The first or lowest level of interconnect wires is typically formed as a first step in the process after which a second or overlying level of interconnect wires is deposited over the first level.

The first level of interconnect wires is typically in contact with active regions in a semiconductor substrate but is not limited to such contact. The first level of interconnect can for instance also be in contact with a conductor that leads to other devices that form part of a larger, multi-chip structure. The two levels of metal wires are connected by openings between the two layers that are filled with metal where the openings between the two layers are lined up with and match contact points in one or both of the levels of metal lines.

Previously used techniques to form multi-levels of wiring apply the technique of first forming the interconnect level metal in a first plane followed by forming the overlying level of interconnect wire in a second plane. This structure typically starts with the surface of a semiconductor substrate into which active devices have been created.

The surface into which the pattern of interconnect lines of the first plane is formed may also be an insulation layer deposited over the surface of the substrate or a layer of oxide may first have been formed on the surface of the substrate. After the layer, into which the pattern of interconnecting wires has to be created, has been defined, the interconnecting pattern itself needs to be defined. This is done using conventional photolithographic techniques whereby the openings are made (in the layer) above the points that need to be contacted in the substrate.

The openings, once created, may be lined with layers of material to enhance metal adhesion (to the sidewalls of the opening), the glue layer, or to prevent diffusion of materials into and from the substrate in subsequent processing steps, the barrier layer.

The final phase in creating the first level of interconnect lines is to fill the created openings with metal, typically aluminum, tungsten or copper, dependent on the particular application and the requirements and restrictions that are imposed by such parameters as line width, aspect ratio of the opening, required planarity of the surface of the deposited metal and others. This process of line formation in overlying layers of metal can be repeated in essentially the same manner as highlighted for the first layer of interconnecting wires.

Applying conventional methods of creating conductive interconnect patterns typically results in the consumption of large amounts of chemicals that are related to photolithographic exposure of the interconnect pattern and to the Reactive Ion Etching (RIE) process that is thereby applied. Due to this consumption of chemicals, the cost of creating conductive interconnect patterns continues to increase, more so in the era of new technology in which more stringent design requirements are imposed.

The increasing use of low-k dielectrics for the insulation of the conductive interconnects further presents additional challenges in the creation of conductive interconnects, such as the potential contamination of the low-k dielectric material during the removal of the exposed photoresist mask after the interconnect pattern has been transferred to the low-k dielectric. A further problem is presented by damage to the low-k dielectric as a result of long exposure times required as part of the applied RIE.

The invention addresses these concerns and provides for the use of a dielectric material into which an interconnect pattern can be directly exposed without the use of an overlying exposure photoresist mask.

U.S. Pat. No. 6,506,979 (Shelnut et al.), U.S. Pat. No. 5,334,488 (Shipley, Jr.) and U.S. Pat. No. 6,521,328 (Lauffer et al.) describe the use of photo-active dielectrics in printed circuit board manufacture.

U.S. Pat. No. 6,349,456 (Dunn et al.) teaches forming a resistor using a photo-active dielectric (PAD).

SUMMARY OF THE INVENTION

A principal objective of the invention is to provide a method of creating interconnect patterns that does not require the creation of an overlying photoresist exposure mask.

Another objective of the invention is to reduce the cost of creating an interconnect pattern in a layer of dielectric.

Yet another objective of the invention is to significantly reduce the materials required for the creation of an interconnect pattern.

A still further objective of the invention is to provide a method for the creation of an interconnect pattern that is particularly suited to the use of a low-k dielectric as insulating material.

A still further objective of the invention is to reduce effects of contamination of the layer of insulation in which an interconnect pattern is created.

A still further objective of the invention is to reduce surface damage to the layer of insulation in which an interconnect pattern is created.

In accordance with the objectives of the invention a new method is provided for the creation of an interconnect pattern. The invention provides for a layer of Photo-Active Dielectric (PAD) to be used for the insulation material in which the interconnect pattern is created, this without the use of an overlying exposure mask of photoresist.

DESCRIPTION OF THE PREFERRED EMBODIMENTS

Figure 1:
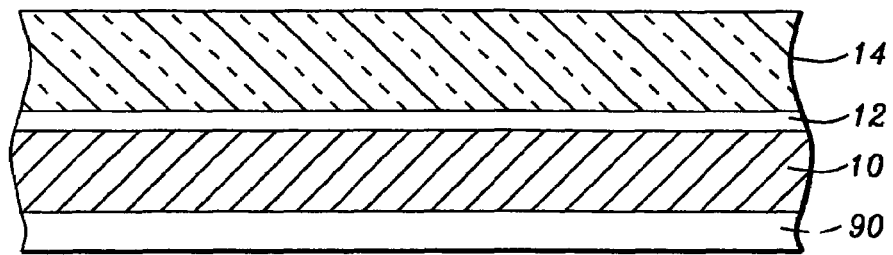
FIGS. 1 through 4 show the application of PAD for the creation of a damascene pattern.

Two widely used approaches in creating metal interconnects is the use of the damascene and the dual damascene structures. The application of the damascene process continues to gain wider acceptance, most notably in the process of copper metalization due to the difficulty of copper dry etch where the damascene plug penetrates deep in very small, sub-half micron, Ultra Large Scale integrated devices. Recent applications have successfully used copper as a conducting metal line, most notably in the construct of CMOS 6-layer copper metal devices.

In the formation of a damascene structure, a metal plug is first formed in a surface, this surface in most instances is the surface of a semiconductor substrate. A layer of Intra Level Dielectric (ILD) is deposited (using for instance Plasma Enhanced CVD technology with $SiO_2$ as a dielectric) over the surface into which trenches for metal lines are formed (using for instance Reactive Ion Etching technology).

The trenches overlay a metal interconnect and are filled with metal (using for instance either the CVD or a metal flow process). Planarization of this metal to the top surface of the layer of ILD completes the damascene structure. Some early damascene structures have been achieved using Reactive Ion Etching (RIE) for the process of planarization but Chemical Mechanical Planarization (CMP) is used exclusively today.

An extension of the damascene process is the dual damascene process whereby an insulating or dielectric material, such as silicon oxide, is patterned with several thousand openings for the conductive lines and vias, which are filled at the same time with metal.

Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed.

One of the dual damascene approaches uses a dielectric layer that is formed by three consecutive depositions whereby the central layer functions as an etch stop layer. This etch stop layer can be SiN, the top and bottom layer of this three layer configuration can be $SiO_2$.

This triple layer dielectric allows first forming the vias by resist patterning the vias and etching through the three layers of dielectric. The conductive trench pattern can then be formed in the top layer of dielectric whereby the central layer of SiN forms the stop layer for the etch of the conductive trench pattern.

Another approach, still using the three-layer dielectric formed on the substrate surface, is to first form the pattern for the conducting lines in the top layer of the dielectric whereby the SiN layer again serves as etch stop. The vias can then be formed by aligning the via pattern with the pattern of the conducting lines and patterning and etching the vias through the etch stop layer of SiN and the first layer of dielectric.

Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited, the conducting lines are now patterned and etched. The SiN layer will stop the etching except where the via openings have already been etched.

Dual damascene is an improvement over single damascene because it permits the filling of both the conductive grooves and vias with metal at the same time, thereby eliminating processing steps.

The invention will now be described in detail, the first embodiment of the invention will be explained using FIGS. 1 through 4, the second embodiment of the invention will be described using FIGS. 5 through 10 while the third embodiment of the invention will be described using FIGS. 11 through 17.

Referring now specifically to FIG. 1, there is shown a cross section of a layer 10 of conductive material, typically comprising a metal such as copper, over which a layer 12 of Anti Reflective Coating (ARC) has been deposited. A layer 14 of Photo-Active Dielectric (PAD) has been deposited over the layer 12 of ARC.

It must be understood in the cross section shown in FIG. 1 that layer 10, of for instance copper, may be deposited over a semiconductor surface 90, preferably but not limited to the surface of a semiconductor substrate.

The semiconductor surface 90 can be a printed circuit board, a flex circuit, a metallized substrate, a glass substrate and a semiconductor device mounting support.

The semiconductor substrate can be a ceramic substrate, a glass substrate, a gallium arsenide substrate, a silicon substrate comprising a single layer of material, such as a silicon wafer or comprising silicon on insulator (SOI) technology and silicon on sapphire (SOS) technology, a doped or undoped semiconductor, an epitaxial layer of silicon supported by a base semiconductor, a sapphire substrate or a substrate used for flat panel displays.

Conventional methods can be applied for the creation of the three layers 10, 12 and 14.

Layer 12 of ARC is deposited to minimize the effect that reflected light has on image creation. A layer of ARC is frequently applied as a blanket deposition over a surface that causes light to be reflected such as a layer of metal, comprising for instance copper.

Layer 12 of ARC can for instance be deposited through a spin coating process followed by a thermal cure at a temperature of about 120 degrees C. for a time period of about 90 seconds to yield a blanket focusing layer when cured of a thickness of about 1,500 Angstrom.

Layer 14, of critical importance to the invention, comprises Photo Active Dielectric (PAD), which is a dielectric material that is sensitive to the exposure of photo-electric energy. This sensitivity to the exposure of photo-electric energy results in changing the chemical composition of the layer of PAD upon exposure by light energy.

Layer 14 preferably comprises a material that is, as stated, sensitive to exposure to photo energy in addition to being thermally compatible with other processes that are used for the creation of semiconductor devices.

Layer 14 for this purpose preferably comprises, without being limited thereto, such materials as contained in the polymer family of polyimide materials. Due to these characteristics of photo-active and thermal compatibility, layer 14 allows, using this layer 14 and of critical importance to the invention, for the pattern definition, the-pattern transfer and the pattern freeze all in this layer 14 of PAD.

For layer 14 can for instance be used a low-k polymer material including polyimides, fluorinated polyimides, polysilsequioxane, benzocyclobutene (BCB), parlene F, parlene N and amorphous polytetrafluoroethylene.

A polymer film can be spun onto the wafer and can contain polycarbonate (PC), polystyrene (PS), polyoxides (PO), polymethylmethacrylate (PMMA) and poly-polyoxides (PPO).

It is important to use a material for the polymer film that can be applied by spin coating and that can, at a later date, be easily removed by dipping the coated semiconductor package in a solvent. Solvents that can be used for this purpose include acetone, THF and trichloro-methane.

The preferred thickness for layer 14 of PAD is between about 5,000 and 15,000 Angstrom.

Relating to layer 14 of PAD the following comments apply:

layer 14 allows for, due to its photosensitivity, the elimination of an additional layer of photoresist that is conventionally required for interconnect pattern definition the layer 14 minimizes the need for RIE application, and by defining the chemical composition of layer 14, low-k dielectric characteristics can be obtained in layer 14.

Figure 2:
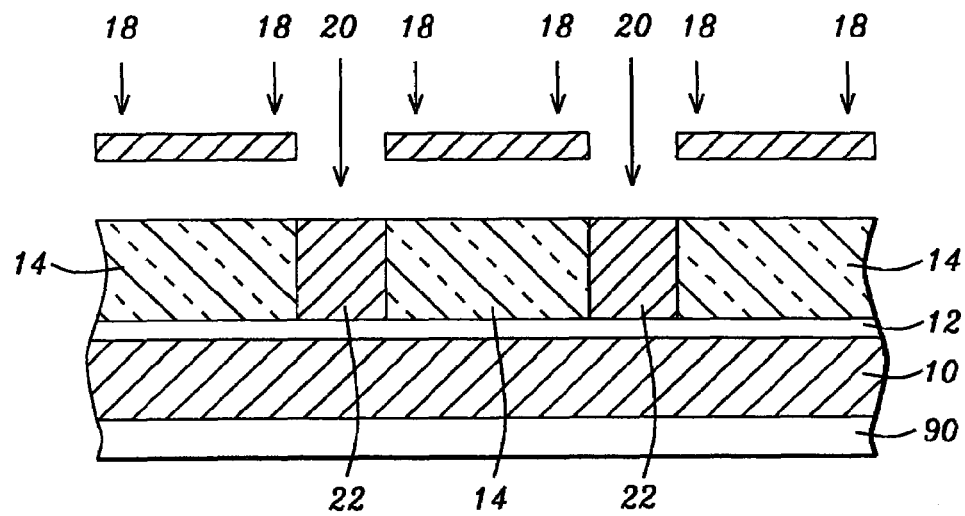

By now interposing, as shown in the cross section of FIG. 2, a mask 16 between a light source 18/20 and the substrate over which the structure that is shown in cross section in FIG. 1 has been created, light 20 of light source 18/20 penetrates the mask 16 and exposes the surface of layer 14 of PAD, converting the chemical composition of layer 14 where light 20 impacts and penetrates layer 14.

The newly created composition of layer 14 is highlighted as layers 22 in the cross section of FIG. 2, the layer 20 remains unchanged in the not exposed to photo energy regions 14, also as highlighted in the cross section of FIG. 2.

For light source 18/20, an UV or DUV light source may be used to project the image of a mask onto a target surface. Any other source of photo-electric energy is equally suitable for the exposure 18/20 such as E-beam lithography, X-ray lithography and ion beam lithography, which are applied by more advanced methods of creating small device features.

Figure 3:
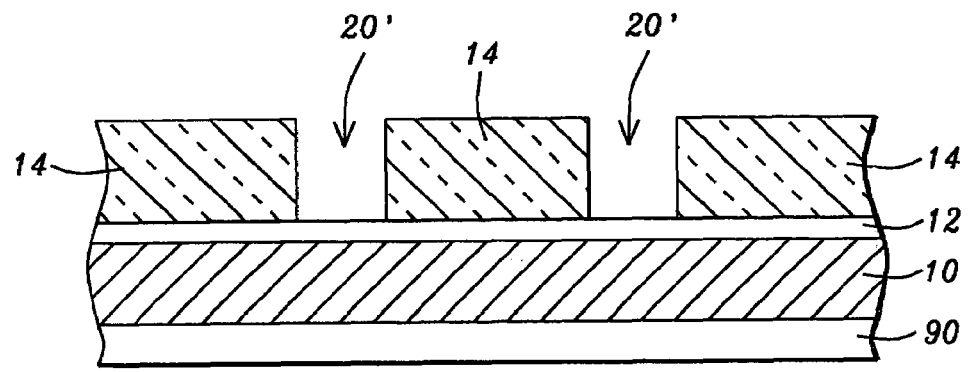

FIG. 3 shows a cross section of the structure after development of the exposed layer 14 of PAD, removing the exposed PAD regions 22 and thereby creating damascene openings 20' through the layer 14 of PAD.

Figure 4:
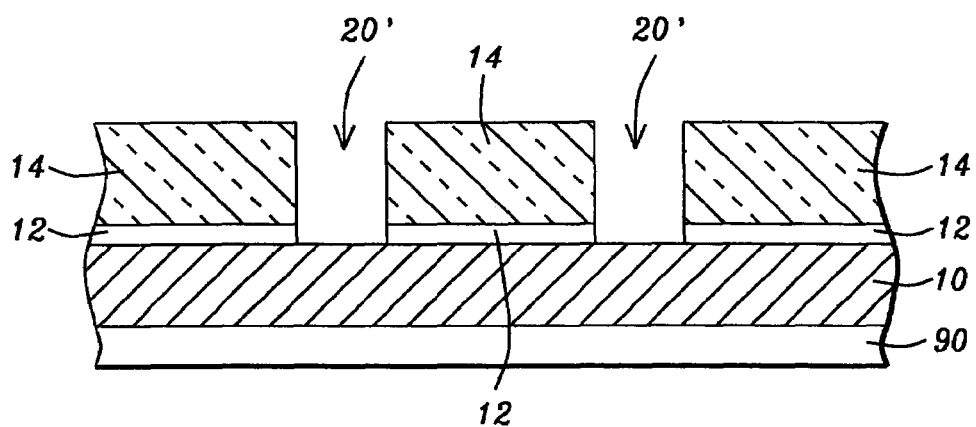

As a final step under the first embodiment of the invention, the layer 12 of ARC is removed from the bottom surface of openings 20', the result of which is shown in the cross section of FIG. 4. The layer 10 of metal, preferably comprising copper, is now exposed, enabling the creation of single damascene interconnects by filling openings 20' with a conductive material, such as copper, which will be in direct contact with the layer 10 of for instance copper.

As an example of layer 12 can be cited a layer of Bottom Anti Reflective Coating (BARC), comprising either SiON or organic BARC, which can be removed from opening 20' with a recipe comprising $O_2$ at a flow rate between 10 and 100 sccm, $N_2$ at a flow rate between 10 and 100 sccm, applied for a time period between about 30 and 60 seconds.

The second embodiment of the invention will now be explained using FIGS. 5 through 10 for this purpose.

Figure 5:
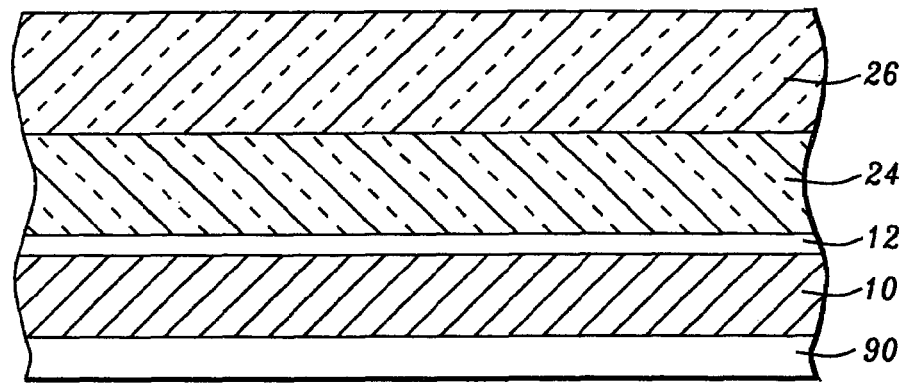
FIGS. 5 through 10 show a first application of PAD for the creation of a dual damascene pattern.

The cross section shown in FIG. 5 will be recognized as the cross section of FIG. 1 with the addition of a second layer 26 of PAD that has been deposited over the first layer 24 of PAD. The first layer 24 of PAD is similar to the layer 14 of PAD that has been shown in the cross section of FIG. 1.

Comments that have been made with respect to layers 10, 12 and 14 of FIG. 1 equally apply to layers 10, 12, 24 (a first layer of PAD) and 26 (a second layer of PAD) shown in cross section in FIG. 5 and are enclosed at this time by reference.

It must further be pointed out that layer 24, the first PAD layer, and layer 26, the second PAD layer, preferably comprise different types of PAD materials, as these PAD materials have previously been defined, and are exposed and subsequently developed using different types of lithographic exposures, thus allowing for the creation of openings having different width or cross sections in the two layers 24 and 26 as is basic to and required for the creation of a dual damascene structure.

As a next step in the process of creating a dual damascene structure, the second PAD layer 26 is first exposed with a first photolithographic exposure 30/32 and developed, similar to the sequence of exposure and development that has previously been described using FIGS. 2 and 3.

Figure 6:
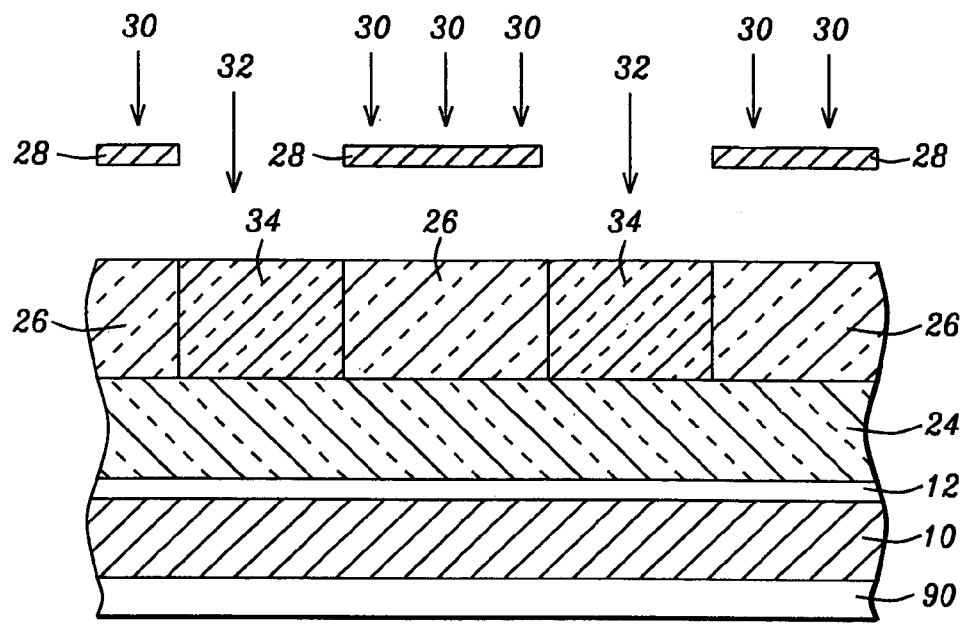

The exposure mask 28, as shown in the cross section of FIG. 6, is for this purpose interposed between the source 30/32 of photo energy and the structure shown in cross section in FIG. 5. The openings created through the exposure mask 28 have the dimensions of a desired trench that forms the upper part of a dual damascene structure, allowing the photo energy 32 to penetrate through the mask 28 and impart photo energy to the second layer 26 of PAD, thereby changing the chemical composition of layer 26 in the highlighted and bounded regions 34 of layer 26.

Figure 7:
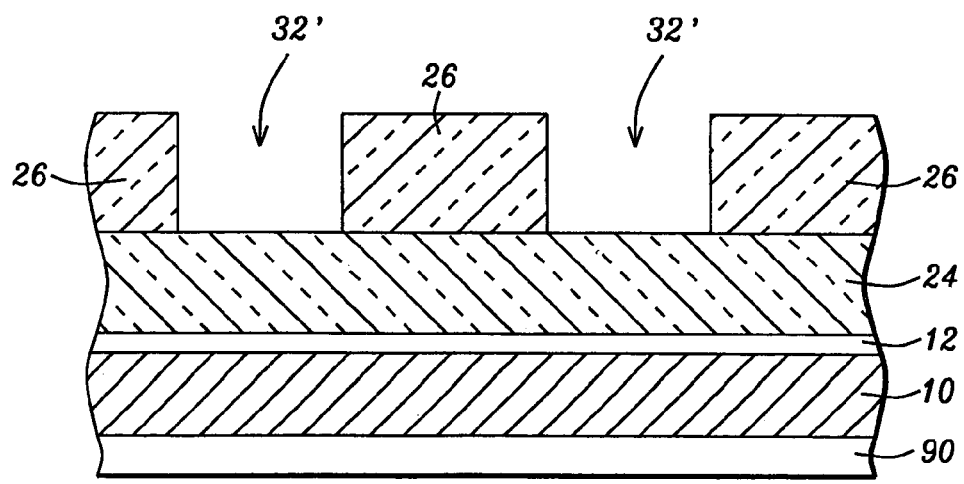

By now developing the exposed portions 34 of the first PAD layer 26, that is removing the second PAD layer from regions 34 highlighted in the cross section of FIG. 6, the cross section of FIG. 7 is obtained wherein first openings 32' have been created through the first layer 26 of PAD. These opening 32' will at a later time be recognized as being the trenches of a dual damascene structure.

Figure 8:
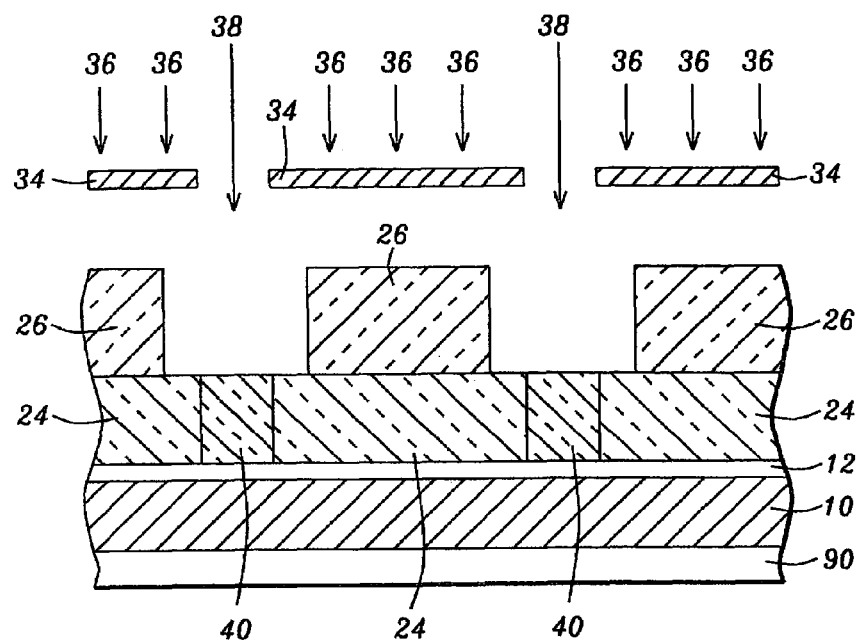

The invention continues, as shown in the cross section of FIG. 8, with a second photolithographic exposure by interposing a second exposure mask 34 between the source 36/38 of light energy and the structure shown in cross section in FIG. 7. The light exposure highlighted as exposure 36 is blocked by the second exposure mask 34 and therefore has no effect on the second layer 26 of PAD or the first layer 24 of PAD. The openings created through the second exposure mask 34, through which light energy 38 is allowed to pass, have the dimensions of a via interconnect that forms part of a dual damascene structure.

The photo electric energy highlighted as 38 in the cross section of FIG. 8 passes through the openings created in the second exposure mask 34, creating a pattern of light exposure in the first layer 24 of PAD that has been highlighted as bounded pattern 40, in which the chemical composition of the first layer 24 of PAD is changed so that this layer can be developed, thus creating the via interconnects of a dual damascene structure.

Figure 9:
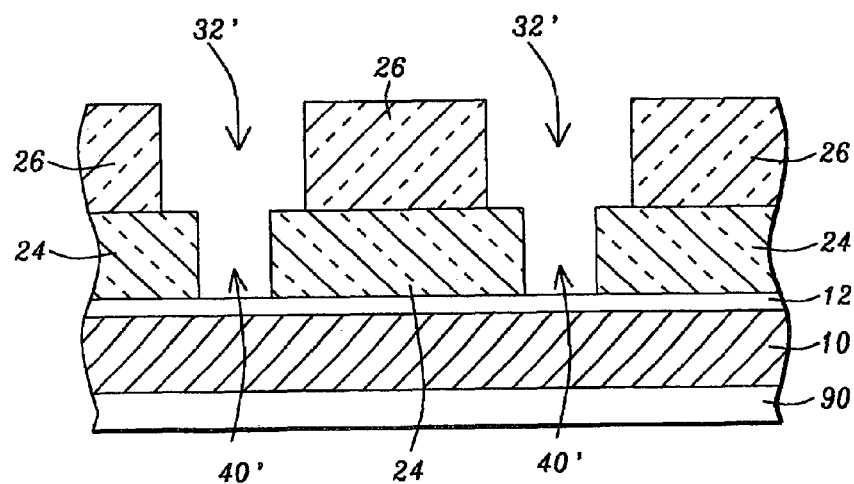

The result, after developing the exposed sections 40 of the first layer 24 of PAD, that is after removing of these exposed portions 40, is shown in the cross section of FIG. 9, wherein the openings 32' will be recognized as being the upper or trench portion of a dual damascene structure while openings 40' will be recognized as being the lower or via interconnect portion of a dual damascene structure.

Figure 10:
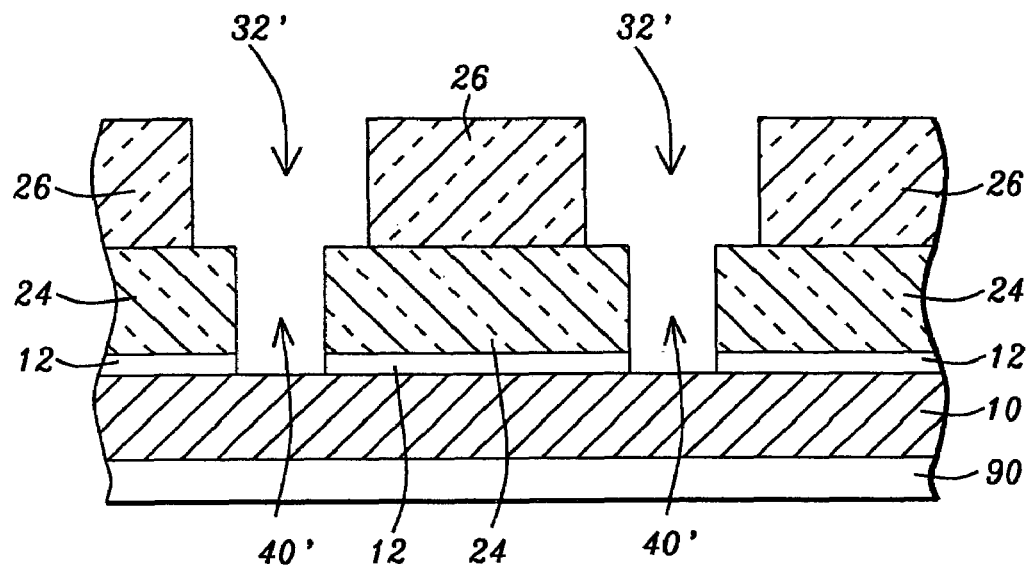

As a final step, the results of which are shown in the cross section of FIG. 10, the layer of ARC is removed from the bottom of openings 32'/40', preventing electrical opening between the bottom metal layer 10 and the dual damascene circuits.

After the cross section that is shown in FIG. 10 has been obtained, the surface of the structure is subjected to a thorough surface clean and a thermal treatment to enhance the quality of the created dual damascene structures.

The cleaning steps may involve wafer scrubbing to remove loose particulate contaminants. Subsequent to a cleaning process, treatment with organic solvents, such as trichloroethylene, acetone, p-xylene, methanol and ethanol, is performed to remove organic impurities such as hydrocarbons and greases, which may remain. A final cleaning may include treatment with various inorganic chemicals to remove heavy metals, for example. These inorganic chemical mixtures are strong oxidants, which form a thin oxide layer at the wafer surface. This oxide layer is stripped, removing impurities absorbed into the oxide layer.

Chemical cleaning for removing chemically bonded film from wafer surface is one in a cleaning process. Conventional chemical cleaning includes a series of acid and rinse baths.

Chemical solutions have been used extensively for the manufacture of semiconductor devices. Wet chemical processing baths have been used for cleaning semiconductor wafers, as well as for etching deposited films on these wafers. For example, the use of hydrogen peroxide ($H_2O_2$) containing solutions for cleaning silicon semiconductor wafers is well known. In addition to wafer cleaning, hydrogen peroxide is utilized in combination with sulfuric acid for photoresist removal and in combination with phosphoric acid, sulfuric acid or ammonium hydroxide for selective titanium etching.

The thermal treatment that is applied to the structure that is shown in cross section of FIG. 10 may be performed at a temperature of about 500 degrees C for a time period of about 10 to 20 minutes.

The third embodiment of the invention starts with the structure that has been shown in the cross section of FIG. 2. This cross section is again shown in the cross section of FIG. 11, the exposure mask 16 and the source 18/20 of light energy, which are shown in FIG. 2, are omitted from the cross section shown in FIG. 11. The steps that are required to create the cross section that is shown in FIG. 1 therefore are assumed to precede the cross section shown in FIG. 11.

Figure 11:
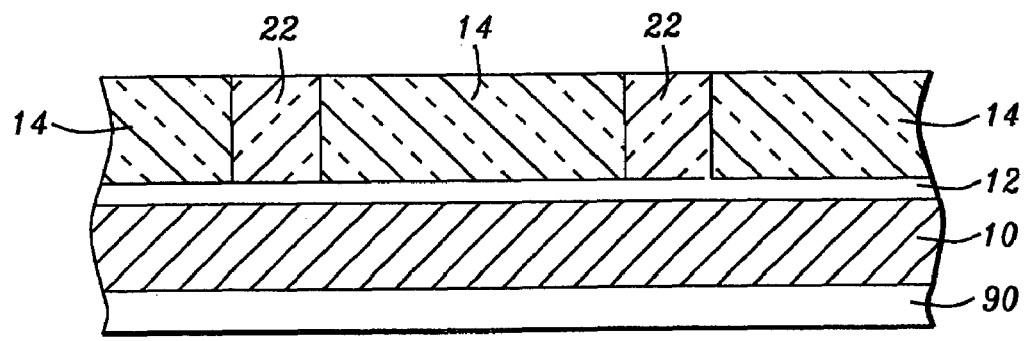
FIGS. 11 through 17 show a second application of PAD for the creation of a dual damascene pattern.

It must be noted in FIG. 11 that the layer 12 of ARC remains in place underneath the exposed regions 22 of the first layer 14 of PAD.

Figure 12:
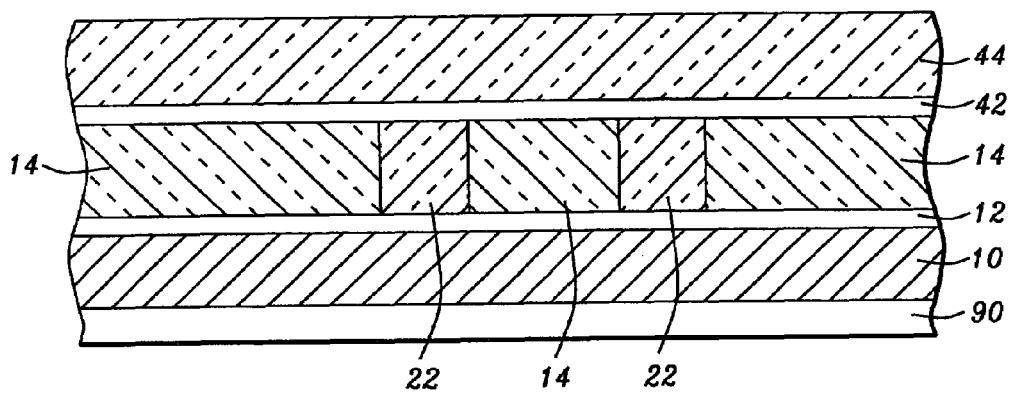

FIG. 12 shows a cross section after a second layer 42 of ARC has been deposited, for the conventional reasons as highlighted previously for the deposition of a layer of ARC, over which a second layer 44 of PAD has been deposited.

Figure 13:
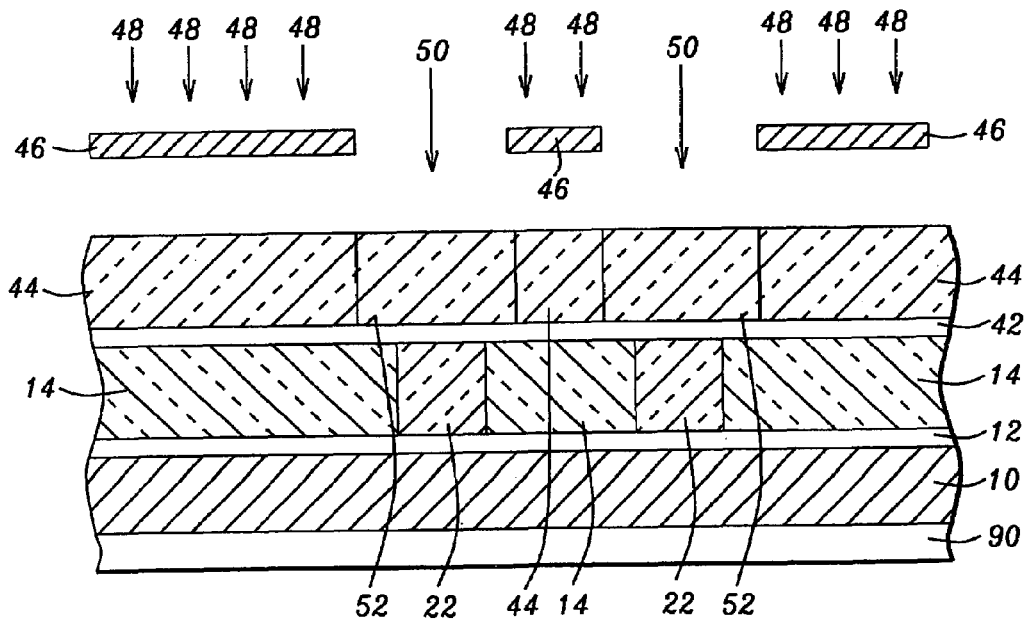

The second layer 44, as shown in the cross section of FIG. 13, is now exposed using exposure mask 46. The openings contained in exposure mask 46 are aligned with regions 22 of the first layer 14 of PAD, the openings in mask 46 have the dimensions of a trench pattern for a dual damascene structure.

Figure 14:
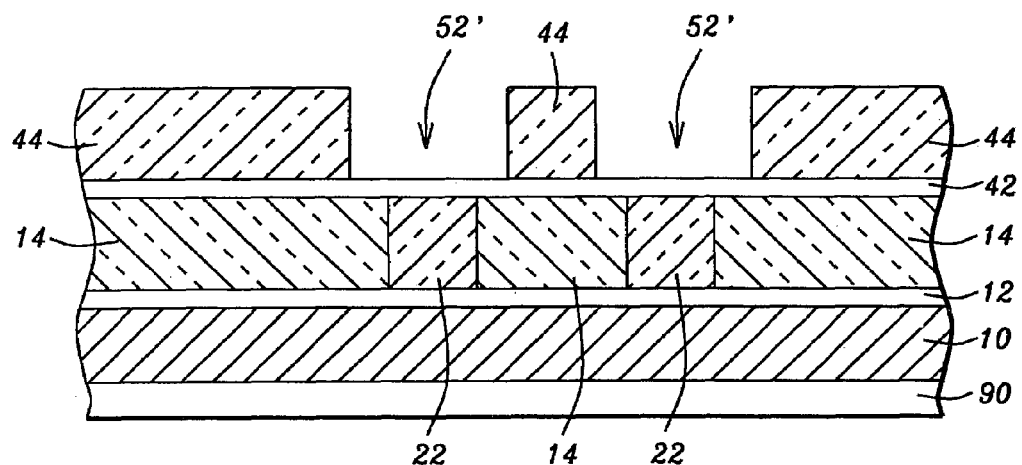

The photo energy exposure 48 is blocked by exposure mask 46 and therefore does not affect the second layer 44 of PAD. The photo energy exposure 50 passes through the exposure mask 46 and therefore changes the chemical composition of the second layer 44 of PAD, preparing the second layer 44 of PAD for development thereof in the regions highlighted as regions 52. After layer 44 has been developed, the cross section that is shown in FIG. 14 is obtained, wherein now trench opening 52' for a dual damascene structure have been created overlying the layer 42 of ARC.

Figure 15:
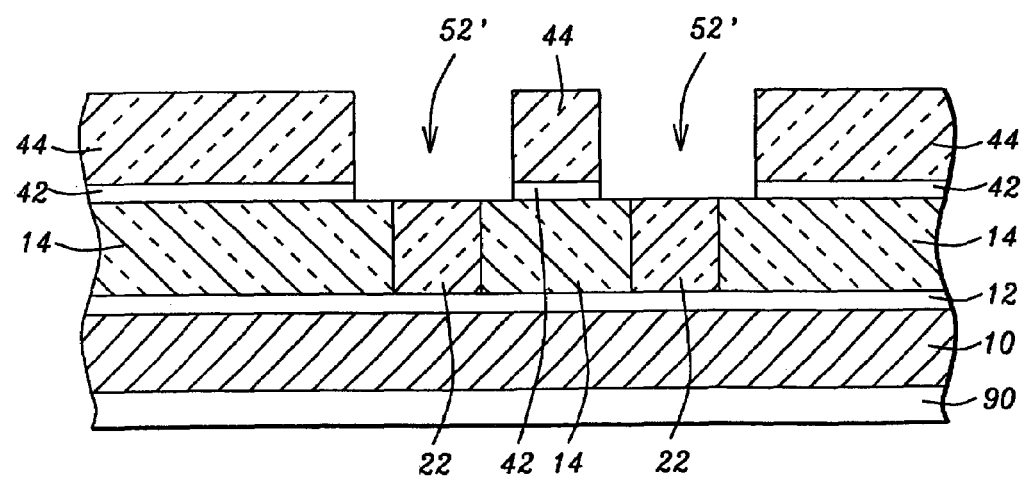
Figure 16:
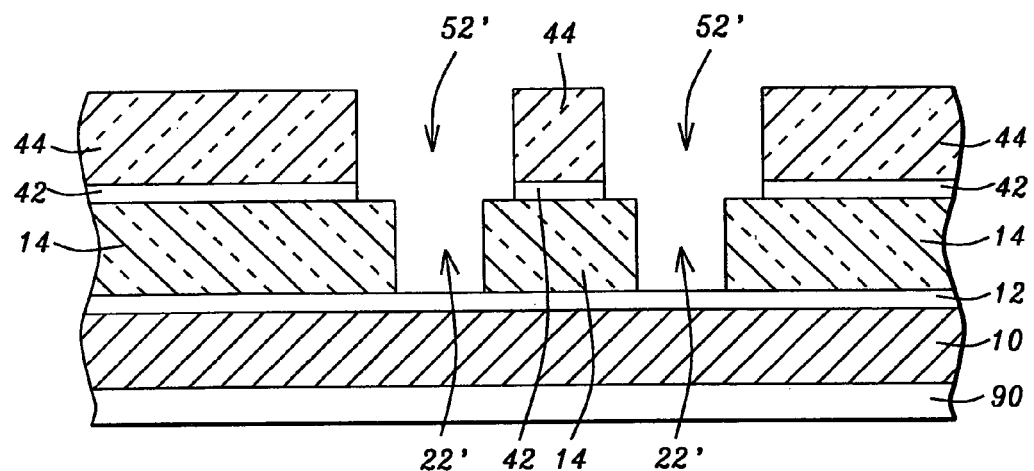

The exposed layer 42 of ARC, overlying the first layer 14 of PAD, is removed from the bottom of openings 52', as shown in the cross section of FIG. 15, after which the exposed layers 22 of the first layer 14 of PAD are removed, as shown in the cross section of FIG. 16.

It is clear from the cross section that is shown in FIG. 16 that the openings 22' and 52' from a dual damascene structure, wherein openings 52' form the upper or trench portion of the dual damascene structure and openings 22' form the lower of via interconnect portions of the dual damascene structure.

Figure 17:
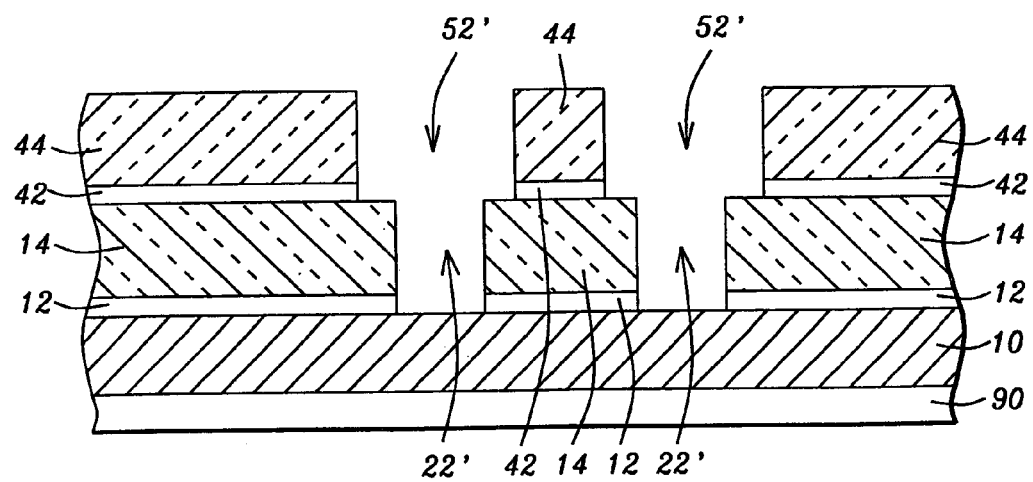

By as a final step removing the exposed first layer 12 of ARC from the bottom of openings 22'/52', the completed dual damascene structure is obtained as shown in the cross section of FIG. 17.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A dual damascene interconnect pattern created in a layer of insulation, comprising:
   a layer of conductive material having been provided over a semiconductor surface, a layer of Anti Reflective Coating (ARC) having been deposited over the layer of conductive material;
   a first layer of Photo-Active Dielectric (PAD) having been deposited over the layer of ARC, the first layer of PAD having been second patterned and developed, having created a via pattern of a dual damascene pattern therein;
   a second layer of Photo-Active Dielectric having been deposited over the first layer of Photo-Active Dielectric, the second layer of Photo-Active Dielectric comprising a Photo-Active Dielectric material having a different chemical composition than the first layer of Photo-Active Dielectric, the second layer of PAD having been first patterned and developed, having created a trench pattern of the dual damascene pattern therein aligned with the via pattern;
   the exposed ARC having been removed from underneath the dual damascene interconnect pattern; and
   the trench pattern and the via pattern having been filled with a conductive material.

2. The dual damascene interconnect pattern 1, wherein the conductive material comprises copper.

3. The dual damascene interconnect pattern 1, wherein the semiconductor surface is a printed circuit board, a flex circuit, a metallized substrate, a glass substrate or a semiconductor device mounting support.

4. The dual damascene interconnect pattern 1, wherein the semiconductor surface is a semiconductor substrate.

5. The dual damascene interconnect pattern 4, wherein the semiconductor surface is a ceramic substrate, a glass substrate, a gallium arsenide substrate, a silicon substrate comprising a single layer of material, such as a silicon wafer or comprising silicon on insulator (SOI) technology and silicon on sapphire (SOS) technology, a doped or undoped semiconductor, an epitaxial layer of silicon supported by a base semiconductor, a sapphire substrate or a substrate used for flat panel displays.

6. The dual damascene interconnect pattern 1, wherein the first layer of Photo-Active Dielectric (PAD) is a polymer.

7. The dual damascene interconnect pattern 1, wherein the first layer of Photo-Active Dielectric (PAD) is a low-k polymer material including polyimides, fluorinated polyimides, polysilsequioxane, benzocyclobutene (BCB), parlene F, parlene N and amorphous polytetrafluorothylene.

8. The dual damascene interconnect pattern 1, wherein the first layer of Photo-Active Dielectric (PAD) is polycarbonate (PC), polystyrene (PS), polyoxides (PO), polymethylmethacrylate (PMMA) and poly-polyoxides (PPO).

9. The dual damascene interconnect pattern 1, wherein the second layer of Photo-Active Dielectric (PAD) is a polymer.

10. The dual damascene interconnect pattern 1, wherein the second layer of Photo-Active Dielectric (PAD) is a low-k polymer material including polyimides, fluorinated polyimides, polysilsequioxane, benzocyclobutene (BCB), parlene F, parlene N and amorphous polytetrafluorothylene.

11. The dual damascene interconnect pattern 1, wherein the second layer of Photo-Active Dielectric (PAD) is polycarbonate (PC), polystyrene (PS), polyoxides (PO), polymethylmethacrylate (PMMA) and poly-polyoxides (PPO).

12. A dual damascene interconnect pattern formed in a layer of insulating material, comprising:
    a layer of conductive material having been provided over a semiconductor surface, a first layer of Anti Reflective Coating (ARC) having been deposited over the layer of conductive material;
    a first layer of Photo-Active Dielectric (PAD) having been deposited over the first layer of ARC, the first layer of PAD having been second patterned and developed, having created a via pattern of a dual damascene pattern;
    a second layer of ARC having been deposited over the first layer of PAD;
    a second layer of Photo-Active Dielectric having been deposited over the second layer of ARC, the second layer of Photo-Active Dielectric comprising a Photo-Active Dielectric material having a different chemical composition than the first layer of Photo-Active Dielectric, the second layer of PAD having been patterned and developed, having created a trench pattern of a dual damascene pattern therein aligned with the via pattern;
    the second layer of ARC having been removed from underneath the trench pattern;
    the first layer of ARC having been removed from underneath the via pattern; and
    the trench pattern and the via pattern having been filled with a conductive material.

13. The dual damascene interconnect pattern of claim 12, wherein the conductive material is copper.

14. The dual damascene interconnect pattern of claim 12, wherein the semiconductor surface is a printed circuit board, a flex circuit, a metallized substrate, a glass substrate or a semiconductor device mounting support.

15. The dual damascene interconnect pattern of claim 12, wherein the semiconductor surface is a semiconductor substrate.

16. The dual damascene interconnect pattern of claim 15, wherein the semiconductor surface is a ceramic substrate, a glass substrate, a gallium arsenide substrate, a silicon substrate comprising a single layer of material, such as a silicon wafer or comprising silicon on insulator (SOI) technology and silicon on sapphire (SOS). technology, a doped or undoped semiconductor, an epitaxial layer of silicon supported by a base semiconductor, a sapphire substrate or a substrate used for flat panel displays.

17. The dual damascene interconnect pattern of claim 12, wherein the first layer of Photo-Active Dielectric (PAD) is a polymer.

18. The dual damascene interconnect pattern of claim 12, wherein the first layer of Photo-Active Dielectric (PAD) is a low-k polymer material including polyimides, fluorinated polyimides, polysilsequioxane, benzocyclobutene (BCB), parlene F, parlene N and amorphous polytetrafluorothylene.

19. The dual damascene interconnect pattern of claim 12, wherein the first layer of Photo-Active Dielectric (PAD) is polycarbonate (PC), polystyrene (PS), polyoxides (PO), polymethylmethacrylate (PMMA) and poly-polyoxides (PPO).

20. The dual damascene interconnect pattern of claim 12, wherein the second layer of Photo-Active Dielectric (PAD) is a polymer.

21. The dual damascene interconnect pattern of claim 12, wherein the second layer of Photo-Active Dielectric (PAD) is a low-k polymer material including polyimides, fluorinated polyimides, polysilsequioxane, benzocyclobutene (BCB), parlene F, parlene N and amorphous polytetrafluorothylene.

22. The dual damascene interconnect pattern of claim 12, wherein the second layer of Photo-Active Dielectric (PAD) is polycarbonate (PC), polystyrene (PS), polyoxides (PO), polymethylmethacrylate (PMMA) and poly-polyoxides (PPO).

* * * * *